US009038004B2

(12) United States Patent
Ford et al.

(10) Patent No.: US 9,038,004 B2
(45) Date of Patent: May 19, 2015

(54) AUTOMATED INTEGRATED CIRCUIT DESIGN DOCUMENTATION

(71) Applicant: INTERNATIONAL BUSINESS MACHINES CORPORATION, Armonk, NY (US)

(72) Inventors: Keith A. Ford, Colorado Springs, CO (US); Rohit Shetty, Essex Junction, VT (US); Sebastian T. Ventrone, South Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/061,042

(22) Filed: Oct. 23, 2013

(65) Prior Publication Data
US 2015/0113487 A1 Apr. 23, 2015

(51) Int. Cl.
G06F 17/50 (2006.01)

(52) U.S. Cl.
CPC .................. *G06F 17/5045* (2013.01)

(58) Field of Classification Search
CPC ............ G06F 17/5045; G06F 17/5022; G06F 17/5004; G06F 17/5072; G06F 17/5077; G06F 17/5081; G06F 2217/74; G01R 31/31704
USPC ......................... 716/102, 112, 136
See application file for complete search history.

(56) References Cited

U.S. PATENT DOCUMENTS

| 7,627,838 | B2* | 12/2009 | Keswick ................. 716/132 |
| 7,770,113 | B1* | 8/2010 | Anderson et al. ............. 715/272 |
| 7,827,517 | B1 | 11/2010 | Orthner |
| 8,181,138 | B2* | 5/2012 | Lindberg et al. ............. 716/113 |
| 8,316,330 | B2 | 11/2012 | Bakshi |
| 2007/0136698 | A1 | 6/2007 | Trujillo et al. |
| 2007/0220462 | A1* | 9/2007 | Lindberg et al. .................. 716/5 |
| 2007/0250803 | A1* | 10/2007 | Hattori et al. .................. 716/18 |
| 2010/0146491 | A1 | 6/2010 | Hirano et al. |
| 2011/0054875 | A1* | 3/2011 | Chang et al. .................... 703/14 |
| 2011/0066994 | A1* | 3/2011 | Kunimoto et al. ............. 716/122 |
| 2011/0214099 | A1 | 9/2011 | Chen et al. |
| 2012/0078968 | A1* | 3/2012 | Nixon .......................... 707/792 |

FOREIGN PATENT DOCUMENTS

| JP | 2007128502 | 5/2007 |
| JP | 2009288986 | 12/2009 |

OTHER PUBLICATIONS

Cypress MicroSystems, 8-bit Programmable System-on-chip (PSoC) Microcontrollers, CY8C25122, CY8C26233, CY8C26443, CY8C26643, Device Data Sheet for Silicon Revision D, Sep. 5, 2002.*
Ventrone et al., "IBM Trusted Automation Methodology Study", GOMACTech Conference, Mar. 28, 2013; 4 pages.

* cited by examiner

*Primary Examiner* — Brian Ngo
(74) *Attorney, Agent, or Firm* — Anthony Canale; Roberts Mlotkowski Safran & Cole, P.C.

(57) ABSTRACT

A method of creating a datasheet includes obtaining integrated circuit data from at least one data source, creating a data structure including the integrated circuit data obtained from the at least one data source, and creating a datasheet using data contained in the data structure. The datasheet is created in a human-readable format.

17 Claims, 4 Drawing Sheets

AUTOMATED INTEGRATED CIRCUIT DESIGN DOCUMENTATION

FIELD OF THE INVENTION

The present invention generally relates to integrated circuit design and, more particularly, to methods and systems for generating a design datasheet.

BACKGROUND

Integrated circuit design and manufacture may include the creation of a datasheet, which is a compilation of various data associated with a device included in an integrated circuit. Typically, the datasheet is created by a technical writer who manually compiles data from a number of sources. The manual process is error prone and labor intensive. Due to the labor intensive nature of the manual process, creating the datasheet is sometimes neglected or disregarded altogether. Further owing to the labor intensive nature of the manual process, a datasheet is typically only created one time, i.e., it is a static document that does not reflect downstream changes in the device design.

SUMMARY

In a first aspect of the invention, there is a method of creating a datasheet. The method includes obtaining, by a computer device, integrated circuit data from at least one data source. The method also includes creating, by the computer device, a data structure including the integrated circuit data obtained from the at least one data source. The method additionally includes creating, by the computer device, a datasheet using data contained in the data structure. The datasheet is created in a human-readable format.

In another of the invention, there is a computer program product for creating an integrated circuit datasheet. The computer program product includes a computer usable storage medium having program code embodied in the storage medium. The program code when executed by a computer device causes the computer device to: obtain data associated with an integrated circuit design from a plurality of different data sources that define the integrated circuit design; create a data structure based on the data obtained from the plurality of different data sources; and create a datasheet based on the data structure and a template. The template defines which parameters of the data structure are included in the datasheet. The datasheet is created in a human-readable format.

In a further aspect of the invention, there is a system including a computer device comprising a processor, a memory, and a datasheet tool stored in the memory and executed by the processor. The datasheet tool is configured to: obtain data associated with an integrated circuit design from a plurality of different data sources that define the integrated circuit design; create a data structure based on the data obtained from the plurality of different data sources; and create a datasheet based on the data structure. The datasheet is created in a human-readable format.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
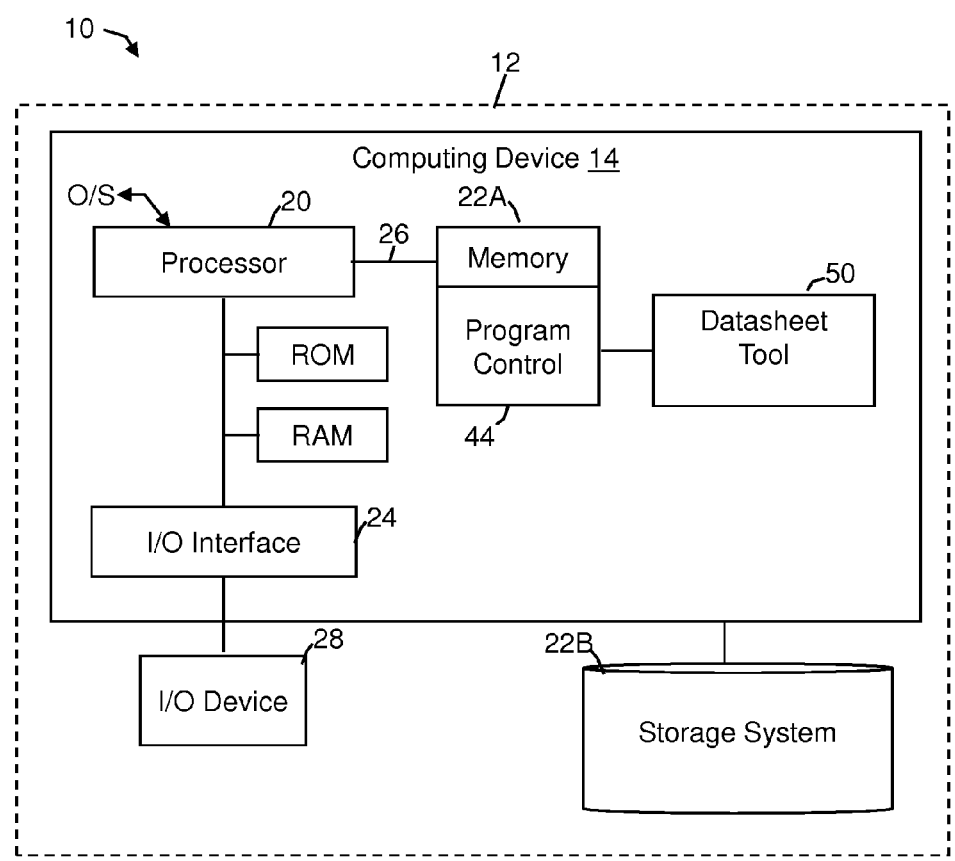
FIG. 1 an illustrative environment for implementing the steps in accordance with aspects of the invention.

The present invention generally relates to integrated circuit design and, more particularly, to methods and systems for generating a design datasheet. According to aspects of the invention, a computer-based tool is configured to read existing deliverables of an integrated circuit macro or circuit, and create a human readable document such as a datasheet. In embodiments, the tool creates a data structure using data collected from the deliverables. The tool may then be used to automatically create a datasheet, either using a default template or a user-customized template. In embodiments, the datasheet is saved as an electronic document, such as an HTML file or the like, which may include insertion links so that an end user may insert additional content and/or change content contained in the datasheet. In this manner, implementations of the invention provide a tool that is useful in the design, manufacture, and use of integrated circuits.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium and/or device (hereinafter referred to as computer readable storage medium). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, environment 10 includes a server 12 or other computing system that can perform the processes described herein. In particular, server 12 includes a computing device 14. The computing device 14 can be resident on a network infrastructure or computing device of a third party service provider (any of which is generally represented in FIG. 1).

The computing device 14 also includes a processor 20 (e.g., CPU), memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 (e.g., user interface) or any device that enables computing device 14 to communicate with one or more other computing devices using any type of communications link. The external I/O device/resource 28 may be for example, a handheld device, PDA, handset, keyboard etc.

In general, processor 20 executes computer program code (e.g., program control 44), which can be stored in memory 22A and/or storage system 22B. Moreover, in accordance with aspects of the invention, program control 44 controls a datasheet tool 50 that is adapted to perform one or more of the processes described herein. The datasheet tool 50 can be implemented as one or more program code in program control 44 stored in memory 22A as separate or combined modules. Additionally, datasheet tool 50 may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention. The bus 26 provides a communications link between each of the components in computing device 14.

According to aspects of the invention, datasheet tool 50 is configured to obtain data from data sources (e.g., deliverables), create a data structure based on the data obtained from the deliverables, and create a datasheet based on data contained in the data structure. In embodiments, deliverables are electronic files and/or data structures that define aspects of the integrated circuit macro or circuit. For example, deliverables may include, but are not limited to: LEF files, timing rule files, Verilog files, GDSII files, CDL netlists, etc. Library Exchange Format (LEF) is a specification for representing the physical layout of an integrated circuit in an ASCII format, and may include design rules and abstract information about the cells. A timing rule file, such as a .lib file or .db file, may include timing information for a typical cell from a cell library, such as setup and hold time. Verilog, standardized as IEEE 1364, is a hardware description language (HDL) used to model electronic systems, and may be used in the design and verification of digital circuits at the register-transfer level of abstraction. GDSII is a database file format for data exchange of integrated circuit or IC layout artwork, and may be a binary file format representing planar geometric shapes, text labels, and other information about the layout in hierarchical form. A netlist describes the connectivity of an electronic design.

In embodiments, the datasheet tool 50 uses data from such deliverables to create a datasheet that provides a user with information associated with design parameters, including but not limited to: technology; technology features (mask levels); size; IP definitions (e.g., IO definitions, etc.); area; timing; power; temperature range; voltage range; metal stack; block diagram; pin diagram; and any written description stored in key comment fields. In aspects described herein, the datasheet is a human-readable and editable document.

The computing device 14 can comprise any general purpose computing article of manufacture capable of executing computer program code installed thereon (e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, server 12 is only illustrative of various types of computer infrastructures for implementing the invention. For example, in embodiments, server 12 comprises two or more computing devices (e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
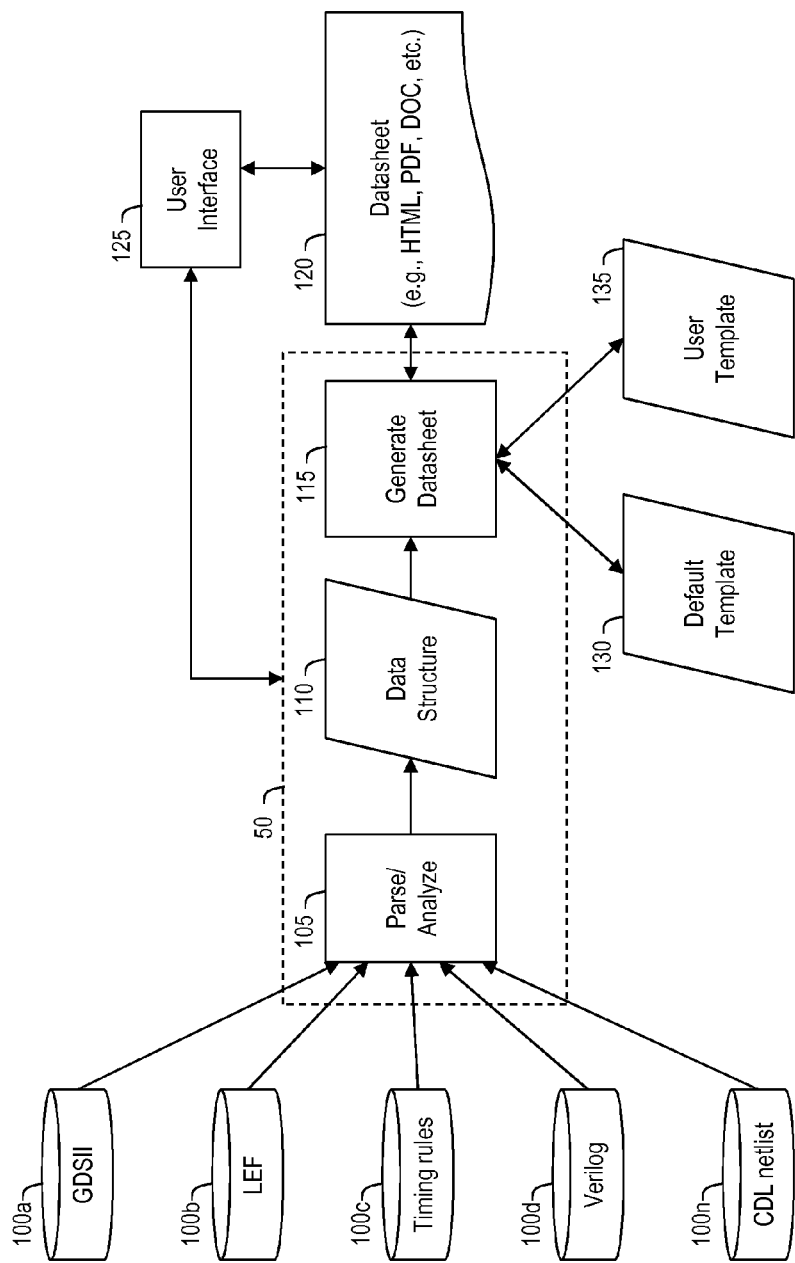
FIG. 2 shows a block diagram in accordance with aspects of the invention.

FIG. 2 shows a block diagram in accordance with aspects of the invention. As depicted in FIG. 2, the datasheet tool 50 (e.g., associated with computing device 14) has access to a number of deliverables 100a-n associated with an integrated circuit macro or circuit. The deliverables 100a-n may be in the form of stored data and may include, for example, GDSII file(s) 100a, LEF file(s) 100b, timing rule file(s) 100c, Verilog file(s) 100d, and netlist file(s) 100n. The invention is not limited to these particular types of deliverables, and any suitable number and/or type of deliverables may be used within the scope of the invention.

As depicted at block 105, datasheet tool 50 obtains data from the deliverables 100a-n by parsing/analyzing the deliverables 100a-n. In embodiments, the datasheet tool 50 is programmed with appropriate logic to parse/analyze the stored data of the deliverables 100a-n and extract data associated with pre-defined parameters from the stored data of the deliverables 100a-n. In this manner, the datasheet tool 50 mines the deliverables 100a-n for information that may be used in preparing the datasheet. For example, the datasheet tool 50 may be configured to parse/analyze the deliverables 100a-n to obtain data (for this macro or circuit) associated with parameters including, but not limited to: Technology; Technology features (mask levels); Size; IP definitions; Area; Timing; Power; Temperature range; Voltage range; Metal Stack; Block Diagram; Pin Diagram; and written description(s) stored in comment field(s). The invention is not limited to these parameters, and the datasheet tool 50 may be adapted to obtain data associated with any parameters that are contained in the deliverables 100a-n.

In aspects of the invention, the datasheet tool 50 creates a data structure 110 containing the data obtained from the deliverables 100a-n. As depicted at block 115, the datasheet tool 50 generates a datasheet 120 using data included in the data structure 110 that was obtained from the deliverables 100a-n. In embodiments, the datasheet 120 is generated and formatted as an HTML, PDF, or DOC document, or the like, that may be displayed to a human user via a computer interface 125. The datasheet tool 50 may generate the datasheet 120 based on a template, such as a default template 130 or a user template 135, as described in greater detail herein.

In one embodiment, the datasheet 120 is generated using a default template 130 that contains a pre-defined list of parameters (e.g., from the data structure 110) with which the datasheet 120 is populated. The default template 130 may also contain definitions of an order and/or layout (e.g., visual appearance) of the parameters in the datasheet 120. For example, the data structure 110 may contain data associated with twenty parameters, and the default template 130 may be configured to populate the datasheet with all twenty of these parameters in a particular order and layout (e.g., visual appearance). In another embodiment, the datasheet 120 is generated using a user template 135 that has been defined by the user, e.g., via interface 125. The user template 135 may contain a different list of parameters and/or different definitions of order and layout (e.g., visual appearance) than those contained in the default template 130. For example, the user template 135 may specify particular ones of the default parameters to be included in the datasheet (e.g., less than the number of default parameters). As another example, the user template 135 may specify other parameters included in the data structure 110, but not included in the default parameters, are to be included in the datasheet. As an additional example, the user template 135 may specify a different order and/or visual layout of the parameters in the datasheet relative the order and/or visual layout defined in the default template 130.

In aspects of the invention, an interface 125 provides a human user the functionality to electronically edit the user template 135. The interface 125 may comprise, for example, a computer-based graphic user interface (GUI) that is part of the datasheet tool 50 or that operatively communicates with the datasheet tool 50. In embodiments, the datasheet tool 50 is configured to display an editable version of the default template 130 to a user via the interface 125, and receive changes to the template from the user via the interface 125. The changes may be stored as a user template 135.

In embodiments, the datasheet tool 50 automatically generates the entire datasheet 120 using data from the data structure 110 and as defined by either the default template 130 or user template 135. In other embodiments, the datasheet tool 50 is configured to display data to a user via the interface 125 as the datasheet 120 is being populated, and prompt the user to accept or edit the data. For example, the datasheet tool 50 may determine from a template (e.g., default template 130 or user template 135) that the datasheet 120 is to include the parameter "voltage range." Further, the datasheet tool 50 may determine from the data structure 110 that the value of "voltage range" for this circuit is 0.8 V to 1.7 V. In embodiments, the datasheet tool 50 displays the proposed value (0.8 V to 1.7 V) to the user via the interface 125. The user may accept or edit the proposed value via the interface 125. When the user accepts the proposed value, the datasheet tool 50 populates the datasheet 120 with the accepted, proposed value (0.8 V to 1.7 V). On the other hand, when the user changes the proposed value via the interface 125, the datasheet tool 50 populates the datasheet 120 with the user-defined value, e.g., 0.0 V to 1.5 V instead of 0.8 V to 1.7 V. In this manner, the datasheet tool 50 may provide the user with the ability to accept or modify each entry of the datasheet 120 as the datasheet 120 is being created. In embodiments, when the user modifies a proposed data value during or after creation of the datasheet 120, the datasheet tool 50 modifies the value of the corresponding data field in the data structure 110.

In aspects of the invention, the datasheet tool 50 is configured to permit the user to edit data in the datasheet 120 after the datasheet 120 is created. In embodiments, the datasheet 120 comprises editable data fields that are linked to corresponding data fields stored in the data structure 110. For example, the datasheet 120 may be an HTML, PDF, DOC or similar document having a plurality of data fields including, but not limited to: Technology; Technology features (mask levels); Size; IP definitions; Area; Timing; Power; Temperature range; Voltage range; Metal Stack; Block Diagram; Pin Diagram; and written description(s) stored in comment field(s). When creating the datasheet 120 in this example, the datasheet tool 50 populates the "Temperature range" data field of the datasheet 120 with a value obtained from a corresponding data field in the data structure 110, e.g., a value of −45° C. to 55° C. in this example. After the datasheet 120 has been created, a user may view the datasheet via interface 125 and change the value in the "Temperature range" data field of the datasheet 120, e.g., from −45° C. to 55° C. to a new value of −40° C. to 50° C. In embodiments, the datasheet tool 50 saves this change in the datasheet 120 such that the new user-defined value of the "Temperature range" is included in the datasheet 120. In embodiments, the datasheet tool 50 also saves this change to the data structure 110 by changing the data value in the corresponding data field in the data structure 110. In this manner, the datasheet tool 50 may provide the user with the ability to change the value(s) of data in the datasheet 120 and in the data structure 110 after the datasheet 120 has been created.

In accordance with aspects of the invention, the datasheet tool 50 is configured to automatically update the data structure 110 based on a change occurring in the data of one of the deliverables 100a-n. For example, the data structure 110 may have a data field corresponding to the parameter "Physical Area" with a stored value of, e.g., 1.972 µm², which was populated by the datasheet tool 50 based on data obtained from the LEF file. Subsequent to the creation of the data structure 110, the LEF file may be updated with a new value for "Physical Area", the new value being 2.000 µm². In embodiments, the datasheet tool 50 is configured to automatically update the data structure 110 to change the value of "Physical Area" from 1.972 µm² to 2.000 µm², i.e., to reflect the change in the deliverable. In the event the datasheet 120 is already created based on initial value (e.g., 1.972 µm²), then the datasheet tool 50 may be configured to also update the datasheet 120 to reflect the new value of the changed parameter (e.g., 2.000 µm²). The datasheet tool 50 may be configured to periodically scan the deliverables 100a-n for such changes to the data contained in the data structure 110, or may be configured to receive push or pull notifications from the deliverables 100a-n for such changes.

Figure 3:
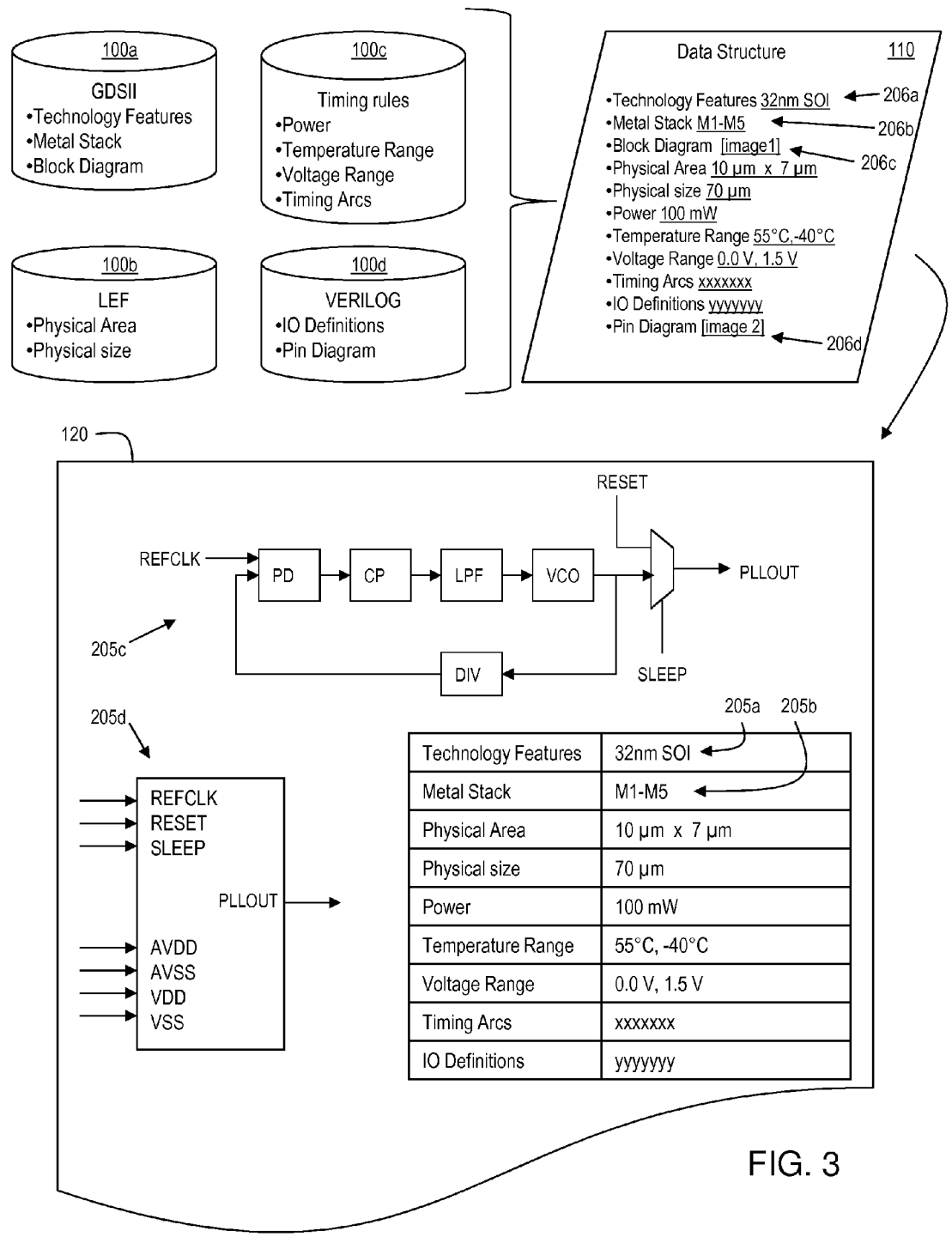
FIG. 3 shows an exemplary datasheet in accordance with aspects of the invention.

FIG. 3 shows an example of a datasheet 120 in accordance with aspects of the invention. As depicted in FIG. 3, data associated with an integrated circuit (e.g., macro, circuit, etc.) is mined from deliverables 100a-d and stored in data structure 110. Datasheet 120 is created based on the data in the data structure 110. As described herein, fields in the datasheet 120 are linked to corresponding fields in the data structure 110. For example, datasheet 120 includes a first field 205a for the parameter "Technology Features" with the value "32 nm SOI" that corresponds to field 206a in the data structure 110. As another example, datasheet 120 includes a second field 205b for the parameter "Metal Stack" with the value "M1-M5" that corresponds to field 206b in the data structure 110. The data structure 110 and datasheet 120 may also include data in the form of images, such as "Block Diagram" 205c, 206c and "Pin Diagram" 205d, 206d. Other respective fields in the datasheet 120 and data structure 110 may have a similar correspondence, as depicted in FIG. 3.

Still referring to FIG. 3, as described herein, fields in the datasheet 120 may be editable by a user (e.g., via interface 125) and linked to corresponding fields in the data structure 110, such that changing the value of a field in the datasheet 120 results in the same change being applied to the value of the corresponding field in the data structure 110. Moreover, in embodiments, a change in a data value at one of the deliverables 100a-d automatically results in the change being applied to the value of the corresponding field in the data structure 110, which in turn results in the same change being applied to the value of the corresponding field in the datasheet 120.

With continued reference to FIG. 3, and as described herein, aspects of the invention provide a user with the ability to change the visual appearance of the datasheet 120. For example, using the interface 125, the user may perform any one or more of the following: de-select one or more of the parameters displayed in the datasheet 120; select other parameters to display in the datasheet 120; change the order of display of parameters in the datasheet 120 (e.g., designate Block Diagram 206c to be shown at the bottom rather than top of the datasheet 120); change the visual appearance of the datasheet 120 (e.g., font size, type, color, formatting, etc.).

The various deliverables, parameters and values described herein are for illustration only, and the invention is not limited to using these deliverables, parameters and values. The following description provides further non-limiting examples of types of data that may be obtained from types of deliverables.

Aspects of the invention may use a GDSII file as a deliverable. The datasheet tool 50 may include or utilize a GDS reader that evaluates the circuit layout and extracts parameters such as: area; metal stack; technology options; mask layers used; comments; block diagram; dimensions; IP definitions; schematic circuit types; and hierarchy. With this data, a human readable block diagram of the circuit can be created in static and/or dynamic form. The static form may be an image file. The dynamic form can be HTML or some other graphic representation of the circuit such that the user can scroll/select/zoom to features, and be able to link back to the data sheet information such as features.

Aspects of the invention may use a CDL netlist file as a deliverable. The datasheet tool 50 may be configured to generate a block diagram by analyzing top levels of the netlist, converting the levels to a schematic, and then converting the schematic to a block diagram. The datasheet tool 50 may also be adapted to extract the following data from a netlist: cell names and pin names.

Aspects of the invention may use an LEF file as a deliverable. The datasheet tool 50 may include or utilize an LEF reader that derives the following information from an LEF file: pin names (e.g., input and output); pin locations; metal stack and layers used; blockages; layout physical size; picture of layout showing pin locations.

Aspects of the invention may use a timing rule file as a deliverable. The timing rule file may be in any suitable format, such as, for example, .lib, .db, etc. For example, the datasheet tool 50 may include or utilize a .lib reader that derives the following information from a .lib file: cell names; pin names; min and max frequency specifications; setup specifications; hold specifications; active power/current specifications; leakage power/current specifications; input voltage level specifications; output voltage level specifications; operating voltage specifications; temperature specifications.

Aspects of the invention may use a Verilog file as a deliverable. The datasheet tool 50 may include or utilize a Verilog reader that derives the following information from a Verilog file: pin names (e.g., input and output); function names; net names; user architecture comments.

Aspects of the invention may use a timing assertion file as a deliverable. The datasheet tool 50 may include or utilize a reader that derives the following information from a timing assertion file: frequency; setups; hold specifications.

In accordance with aspects of the invention, the data structure 110 is created with defined fields corresponding to the parsed data that is mined from the deliverables. So, for example, the data structure 110 may contain a field that has a growable number of entries for the timing information derived from the timing rule file. In embodiments, the data structure 110 is a dynamic structure that allows a variable amount of content per data descriptor field. For incomplete deliverables, that portion of the data structure 110 would be a default structure indicating missing data. In this manner, the datasheet tool 50 may read the appropriate data from the data structure 110 when generating the datasheet 120.

According to aspects of the invention, once the physical deliverables have been read/parsed and the data structure 110 populated, the datasheet tool 50 starts with a master blank template, e.g., default template 130. In embodiments, the default template 130 defines breaks which are programmed for links into data structure. The datasheet tool 50 may have a defined use of each data type field with a design template for look and style of the output structure. The datasheet tool 50 may also permit user customization of the datasheet, e.g., via a user template 135. The datasheet tool 50 may be adapted to present a GUI to the user by which the user may: change the style template for tailoring the output of the form; define header/footers and other style constructs; input additional material; and change or replace (partially or fully) already-generated portions of the datasheet 120. In this manner, implementations of the invention may be used to create an electronic datasheet in the form of, for example, HTML and graphical text file along with insertion links by which an end user may insert additional content and/or replace technical information.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 4:
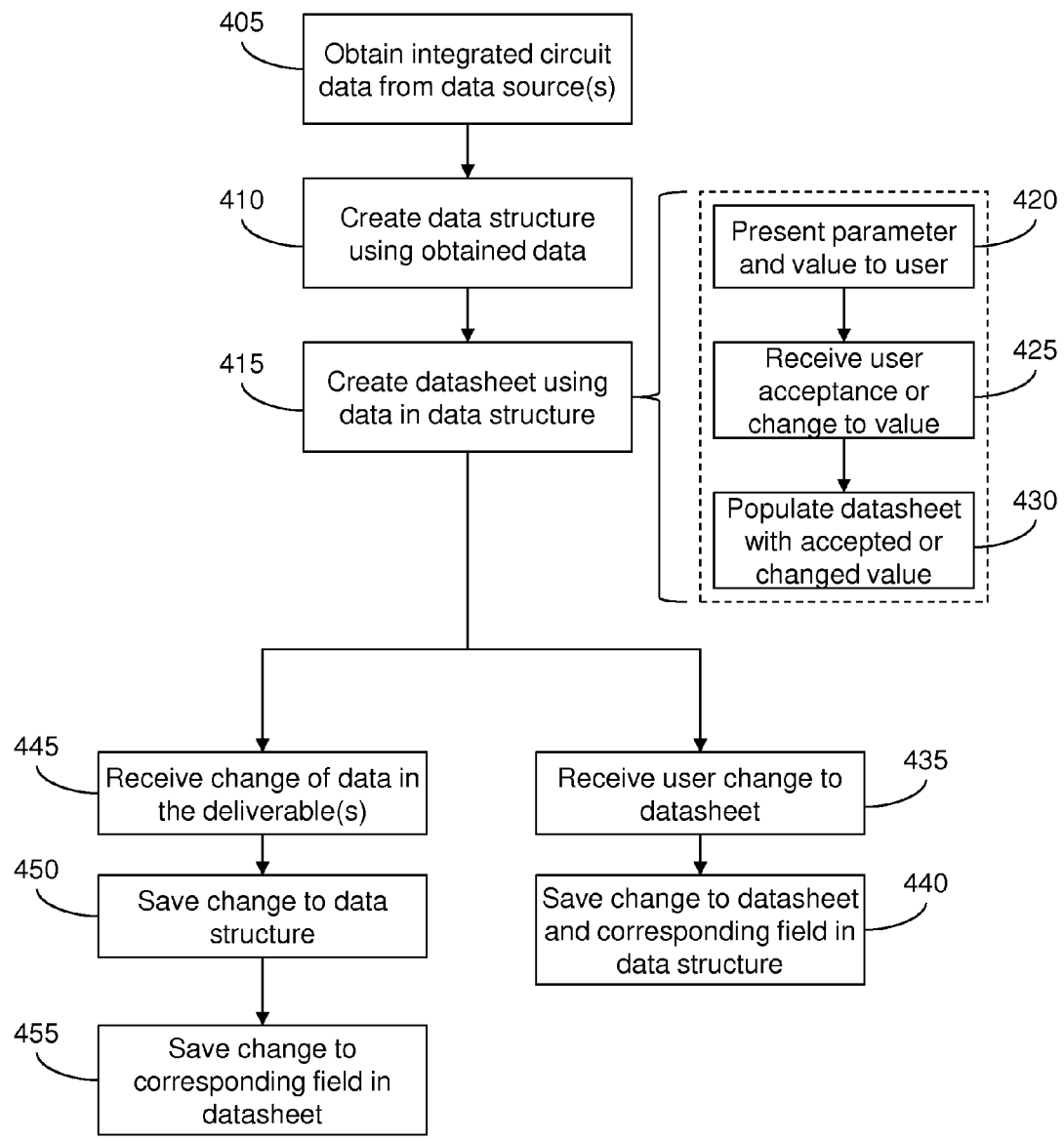
FIG. 4 shows an exemplary flow in accordance with aspects of the invention.

FIG. 4 depicts an exemplary flow for a process in accordance with aspects of the present invention. The steps of FIG. 4 may be implemented in the environment of FIG. 1, for example. At step 405, a computer-based tool (e.g., datasheet tool 50) obtains data about an integrated circuit from one or more data sources (e.g., deliverables 100*a-n*). Step 405 may be performed in a manner similar to that described with respect to block 105 of FIG. 2.

At step 410, the tool creates a data structure (e.g., data structure 110) using the data obtained at step 405. At step 415, the tool creates a data sheet (e.g., data sheet 120) using data contained in the data structure that was created at step 410. Step 415 may be performed in a manner similar to that described with respect to block 115 of FIG. 2. Step 415 may include generating the datasheet according to a template (e.g., a default template 130 or a user template 135). Step 415 may include automatically creating the datasheet, e.g., without using values provided by a user. Step 415 may alternatively include presenting parameters and values to the user (e.g., via interface 125) at step 420, receiving user acceptance of the value or a user-made change to the value at step 425, and populating the particular parameter and value in the datasheet at step 430 based on the user acceptance or the user-made change.

Following creating the datasheet, at step 435 the tool may receive a user-made change to a data value in the datasheet, e.g., via the user interface. At step 440, the tool saves the user-made change to the particular value in the datasheet, and also saves the user-made change to a value in a corresponding field in the data structure.

Following creating the datasheet, at step 445 the tool may receive a change to a data value in a data source. At step 450, the tool updates the appropriate field in the data structure that corresponds to the changed data value in the data source. At step 455, the tool updates a field in the datasheet that corresponds to the updated field in the data structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of creating a datasheet, comprising:
   obtaining, by a computer device, integrated circuit data from at least one data source;
   creating, by the computer device, a data structure including the integrated circuit data obtained from the at least one data source; and
   creating, by the computer device, a datasheet using data contained in the data structure, the datasheet including data fields that are electronically editable by a user;
   receiving, by the computer device, a change to a respective one of the data fields in the datasheet; and
   applying, by the computer device, the change to a corresponding data field in the data structure,
   wherein the datasheet is created in a human-readable format, and each one of the data fields in the datasheet is linked to the corresponding data field in the data structure, and
   the creating the datasheet is provided by program control that controls a datasheet tool residing on the computer device and which comprises:
       presenting a proposed data value to a user;
       receiving one of acceptance and a different value from the user; and
       populating the datasheet with one of the proposed value and the different value based on the receiving.

2. The method of claim 1, further comprising:
receiving a change to a data value from the at least one data source; and
applying the change to a corresponding data field in the data structure.

3. The method of claim 2, further comprising applying the change to a corresponding one of the data fields in the datasheet.

4. The method of claim 1, further comprising creating the datasheet based on a template.

5. The method of claim 4, wherein the template is a user-defined template.

6. The method of claim 4, wherein the template is a pre-defined default template.

7. The method of claim 4, further comprising:
receiving changes to a default template from a user; and
saving the changes in a user-defined template, wherein the creating the datasheet is performed based on the user-defined template.

8. The method of claim 1, wherein the creating the datasheet is performed automatically without receiving user-made changes to the data.

9. The method of claim 1, wherein the at least one data source comprises a plurality of data sources.

10. The method of claim 9, wherein the plurality of data sources includes at least two of: a GDSII file; an LEF file, a timing rule file, a Verilog file, and a CDL netlist.

11. The method of claim 1, wherein the human-readable format comprises an HTML file.

12. The method of claim 1, wherein the datasheet includes at least one of a block diagram and a pin diagram that are generated by the computer device.

13. The method of claim 1, wherein the datasheet includes: a block diagram; a pin diagram; area; size; power; temperature range; voltage range; and IP definitions.

14. A computer program product for creating an integrated circuit datasheet, the computer program product comprising a non-transitory computer usable storage medium having program code embodied in the storage medium, the program code when executed by a datasheet tool residing on a computer device causes the computer device to:
obtain data associated with an integrated circuit design from a plurality of different data sources that define the integrated circuit design;
create a data structure based on the data obtained from the plurality of different data sources; and
create a datasheet based on the data structure and a template, wherein:
the datasheet includes data fields that are editable by a user via a computer-based user interface;
each of the data fields in the datasheet is linked to a corresponding data field in the data structure, such that a user-made change to one of the data fields in the datasheet is automatically applied to the corresponding data field in the data structure;
the template defines which parameters of the data structure are included in the datasheet; and
the datasheet is created in a human-readable format, and the creating of the datasheet based on the data structure and the template further includes:
presenting a proposed data value to a user;
receiving one of acceptance and a different value from the user; and
populating the datasheet with one of the proposed value and the different value based on the receiving.

15. A system, comprising:
a computer device comprising a processor and a memory; and
a datasheet tool stored in the memory and executed by the processor, wherein the datasheet tool is configured to:
obtain data associated with an integrated circuit design from a plurality of different data sources that define the integrated circuit design;
create a data structure based on the data obtained from the plurality of different data sources; and
create a datasheet based on the data structure, wherein:
the datasheet includes data fields that are editable by a user via a computer-based user interface;
each of the data fields in the datasheet is linked to a corresponding data field in the data structure, such that a user-made change to one of the data fields in the datasheet is automatically applied to the corresponding data field in the data structure; and
the datasheet is created in a human-readable format, and the creating of the datasheet based on the data structure includes:
presenting a proposed data value to a user;
receiving one of acceptance and a different value from the user; and
populating the datasheet with one of the proposed value and the different value based on the receiving.

16. The computer program product of claim 14, wherein the template is one of a user-defined template and a pre-defined default template, and further comprising:
receiving changes to the default template from the user; and saving the changes in a user-defined template, wherein the creating the datasheet is performed based on the user-defined template.

17. The system of claim 15, wherein the datasheet tool is configured to create the datasheet based on a template, wherein the template is one of a user-defined template and a pre-defined default template, and further comprising:
receiving changes to the default template from the user; and
saving the changes in a user-defined template, wherein the creating the datasheet is performed based on the user-defined template.

* * * * *